(12) United States Patent
Shibata et al.

(10) Patent No.: US 8,664,028 B2
(45) Date of Patent: Mar. 4, 2014

(54) SEMICONDUCTOR DEVICE PRODUCTION PROCESS

(75) Inventors: Yasuyuki Shibata, Yokohama (JP); Ji-Hao Liang, Kawasaki (JP)

(73) Assignee: Stanley Electric Co., Ltd., Tokyo (JP)

( * ) Notice: Subject to any disclaimer, the term of this patent is extended or adjusted under 35 U.S.C. 154(b) by 34 days.

(21) Appl. No.: 13/416,344

(22) Filed: Mar. 9, 2012

(65) Prior Publication Data
US 2012/0231568 A1    Sep. 13, 2012

(30) Foreign Application Priority Data
Mar. 11, 2011  (JP) .................. 2011-054659

(51) Int. Cl.
*H01L 21/18*  (2006.01)
*H01L 31/18*  (2006.01)

(52) U.S. Cl.
USPC ............ 438/46; 438/456; 438/458; 438/493; 438/977; 257/E21.097; 257/E33.006; 257/E33.025

(58) Field of Classification Search
USPC .......................... 438/46, 456, 458, 493, 977; 257/E21.097, E33.006, E33.025
See application file for complete search history.

(56) References Cited

U.S. PATENT DOCUMENTS

| | | | |
|---|---|---|---|
| 6,265,289 B1 | 7/2001 | Zheleva et al. | |
| 6,559,075 B1 | 5/2003 | Kelly et al. | |
| 6,734,503 B2 | 5/2004 | Hata et al. | |
| 6,790,695 B2 | 9/2004 | Ogihara et al. | |
| 7,087,930 B2 | 8/2006 | Senda et al. | |
| 7,445,673 B2 | 11/2008 | Beaumont et al. | |
| 7,588,998 B2 | 9/2009 | Fehrer et al. | |
| 7,713,840 B2 | 5/2010 | Kelly et al. | |
| 7,745,843 B2 | 6/2010 | Baba et al. | |
| 7,829,913 B2 | 11/2010 | Shibata et al. | |
| 7,981,713 B2 * | 7/2011 | Shibata | 438/47 |
| 8,236,672 B2 * | 8/2012 | Chinone et al. | 438/481 |
| 2009/0079035 A1 * | 3/2009 | Wang | 257/615 |
| 2009/0311847 A1 | 12/2009 | Fehrer et al. | |

(Continued)

FOREIGN PATENT DOCUMENTS

| JP | 2000-228539 A | 8/2000 |
|---|---|---|
| JP | 2004-172351 A | 6/2004 |

(Continued)

*Primary Examiner* — Mary Wilczewski
(74) *Attorney, Agent, or Firm* — Holtz, Holtz, Goodman & Chick

(57) ABSTRACT

(a) On a growth substrate, a void-containing layer that is made of a group III nitride compound semiconductor and contains voids is formed. (b) On the void-containing layer, an n-type layer that is made of an n-type group III nitride compound semiconductor and serves to close the voids is formed. (c) On the n-type layer, an active layer made of a group III nitride compound semiconductor is formed. (d) On the active layer, a p-type layer made of a p-type group III nitride compound semiconductor is formed. (e) A support substrate is bonded above the p-type layer. (f) The growth substrate is peeled off at the boundary where the voids are produced. In the above step (a) or (b), the supply of at least part of the materials that form the layer is decreased, while heating, before the voids are closed.

7 Claims, 4 Drawing Sheets

(56) References Cited

U.S. PATENT DOCUMENTS

| | | |
|---|---|---|
| 2010/0155740 A1 | 6/2010 | Chinone et al. |
| 2011/0156047 A1* | 6/2011 | Tsay et al. .................. 257/76 |
| 2012/0040484 A1 | 2/2012 | Fehrer et al. |
| 2012/0199810 A1* | 8/2012 | Lee ............................. 257/13 |
| 2012/0231568 A1* | 9/2012 | Shibata et al. .............. 438/47 |
| 2012/0231608 A1* | 9/2012 | Shibata et al. ............. 438/458 |
| 2013/0026531 A1* | 1/2013 | Seo et al. .................... 257/99 |
| 2013/0037857 A1 | 2/2013 | Von Kanel et al. |
| 2013/0140517 A1 | 6/2013 | Tang et al. |

FOREIGN PATENT DOCUMENTS

| | | |
|---|---|---|
| JP | 2005-516415 A | 6/2005 |
| JP | 2007-266472 A | 10/2007 |
| JP | 2010-153450 A | 7/2010 |
| JP | 2011-192899 A | 9/2011 |
| JP | 2012-009483 A | 1/2012 |
| WO | WO 98-14986 A1 | 4/1998 |

* cited by examiner

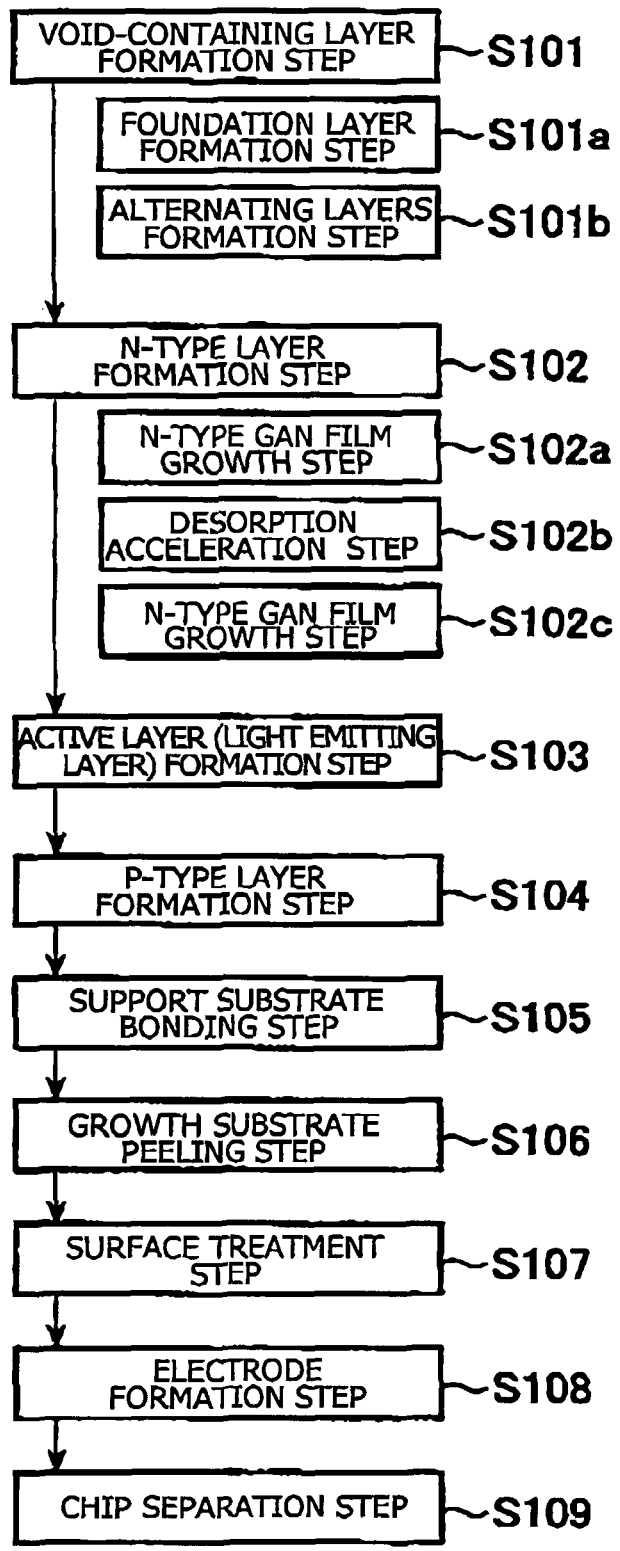

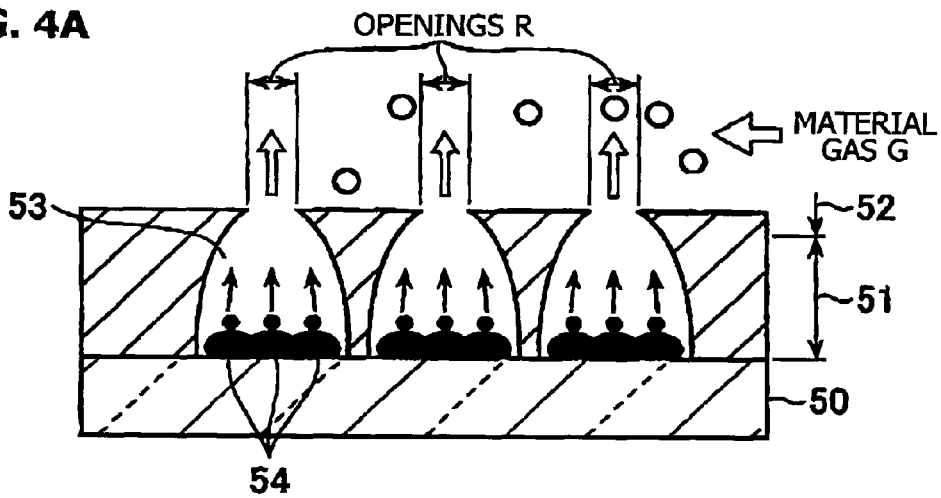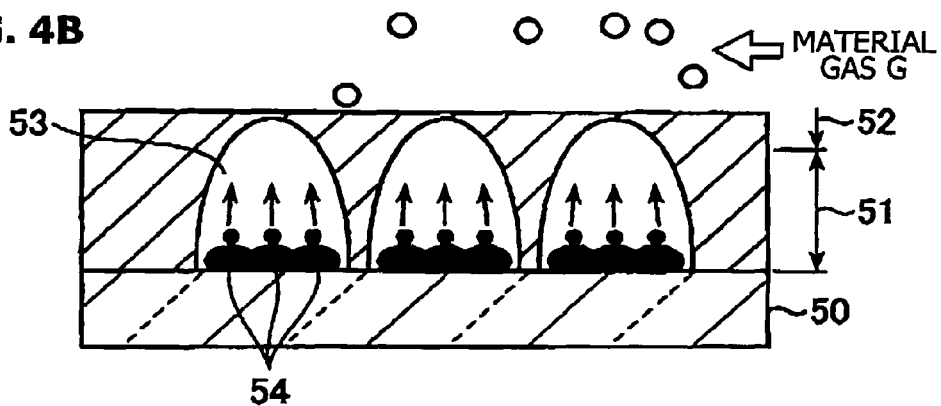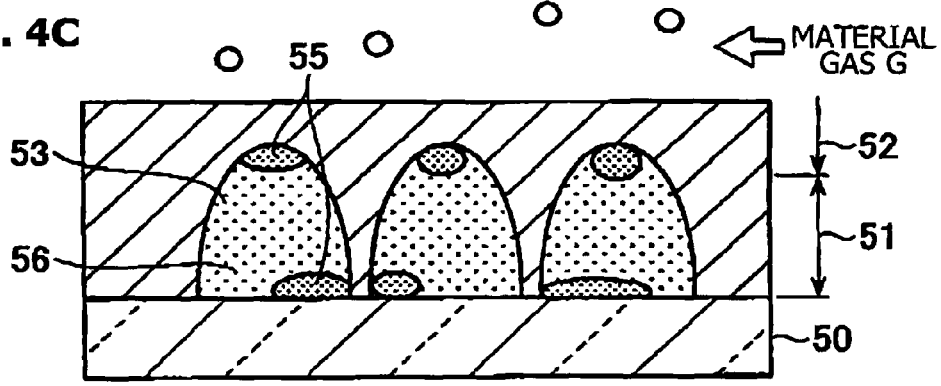

SEMICONDUCTOR DEVICE PRODUCTION PROCESS

CROSS-REFERENCE TO RELATED APPLICATION

This application is based upon and claims the benefit of priority of the prior Japanese Patent Application No. JP 2011-054659, filed on Mar. 11, 2011, the entire contents of which are incorporated herein by reference.

BACKGROUND OF THE INVENTION

A) Field of the Invention

The present invention relates to a production process for semiconductor devices such as light emitting diode.

B) Description of the Related Art

Commonly, a light emitting diode (LED) is produced by forming a semiconductor multilayer film (semiconductor layer) consisting of an n-type layer, active layer (light emitting layer), p-type layer, etc., on a substrate and subsequently forming electrodes on the surfaces of the substrate and the semiconductor multilayer film. In the case of using a growth substrate of an insulating material, an appropriate region of the semiconductor layer is etched by, for instance, reactive ion etching to expose part of the n-type layer, followed by forming an electrode in the n-type layer and another electrode in the p-type layer.

The selection of the material for the growth substrate can have a large influence on the crystal quality of the resulting semiconductor layer. The electric conductivity, thermal conductivity, and light absorption coefficient of the growth substrate, however, can also have an influence on the electric, thermal, and optical characteristics of the resulting light emitting diode. It cannot be expected that a growth substrate suitable for forming a semiconductor layer with good crystal characteristics always serves to produce a semiconductor device that is also good in all other characteristics. Some studies have proposed thin-film LEDs or laser diodes (LDs) that are produced by peeling off the semiconductor layer from the growth substrate and forming electrodes directly on the semiconductor layer that contributes to light emission (for instance, see Domestic re-publication of PCT international application WO98-14986 as Patent document 1, Japanese Unexamined Patent Publication (Kokai) No. 2005-516415 as Patent document 2, Japanese Unexamined Patent Publication (Kokai) No. 2000-228539 as Patent document 3, and Japanese Unexamined Patent Publication (Kokai) No. 2004-172351 as Patent document 4). The removal of the growth substrate improves electric, thermal, and optical characteristics. The laser lift-off technique is generally used for the removal of the growth substrate.

Some documents have disclosed inventions of semiconductor device production processes that comprise forming a void-containing layer on a growth substrate, growing an n-type layer, light emitting layer, and p-type layer on it, bonding a support substrate, and then applying an impact to the void-containing layer to peel off the growth substrate (for instance, see Japanese Unexamined Patent Publication (Kokai) No. 2010-153450 as Patent document 5). For the invention described in Patent document 5, a void-containing layer is formed by alternately performing a step for preferred growth in the horizontal direction (in-plane direction of the layer) and a step for preferred growth in the vertical direction (thickness direction of the layer). The openings in the void-containing layer are closed by an n-type layer formed on the void-containing layer.

The semiconductor device production process proposed in Patent document 5 sometimes suffers from a problem as described below.

FIGS. 4A to 4C are cross sections containing a void-containing layer. The problem with the conventional processes is described below with reference to FIGS. 4A to 4C.

Refer to FIG. 4A. A void-containing layer 51 of GaN is located on a growth substrate 50. A material gas G is being supplied to form an n-type layer 52, which is an n-type GaN film, on the void-containing layer 51. Voids 53 are being generated in the void-containing layer 51 and in the n-type layer 52 that is being formed. In this figure, R denotes the openings of the voids 53.

The voids 53 are being closed as the n-type layer 52 grows in the horizontal direction. At the same time, nitrogen gas ($N_2$) resulting from the decomposition of the semiconductor and the GaN crystals 54 in the voids 53 gets out of the voids 53 through the openings R.

Refer to FIG. 4B. FIG. 4B illustrates a later state of the n-type layer 52 formation following the state in FIG. 4A. The voids 53 are closed as a result of the growth of the n-type layer 52. The voids 53 contain GaN crystals 54 remaining inside. The desorption and decomposition of the semiconductor material and GaN crystals 54 continue in the voids 53 after the voids 53 are closed.

Refer to FIG. 4C. FIG. 4C illustrates a later state of the n-type layer 52 formation following the state in FIG. 4B. Ga melts 55 and $N_2$ gas 56 are generated in the voids 53 as the semiconductor material and GaN crystals 54 desorb and decompose in the voids 53 after the closure of the voids 53. The $N_2$ gas 56 generated acts to increase the pressure in the voids 53. There have been problems with this rise in pressure, which can cause, for instance, peeling of the growth substrate 50 during the formation of the n-type layer 52 etc., leading to a decrease in yield. In the voids 53, in particular, the desorption and decomposition of the GaN crystals 54 remaining on the growth substrate 50 (bottom face of the voids 53) do not contribute to the formation of the voids 53, but act to increase the pressure in the voids 53.

SUMMARY OF THE INVENTION

The invention aims to provide a semiconductor device production process that is high in yield.

An aspect of the present invention provides a semiconductor device production process comprising: (a) forming on a growth substrate a void-containing layer that is made of a group III nitride compound semiconductor and contains voids, (b) forming on the void-containing layer an n-type layer that is made of an n-type group III nitride compound semiconductor and serves to close the voids, (c) forming on the n-type layer an active layer made of a group III nitride compound semiconductor, (d) forming on the active layer a p-type layer made of a p-type group III nitride compound semiconductor, (e) bonding a support substrate above the p-type layer, and (f) peeling off the growth substrate at the boundary where the voids are produced, wherein in the step (a) or (b), the supply of at least part of the materials for forming the layer is decreased, while heating, before the voids are closed.

The invention can provide a semiconductor device production process that is high in yield.

BRIEF DESCRIPTION OF THE DRAWINGS

FIG. 1 gives a flow chart schematically illustrating the semiconductor device production process according to an embodiment of the invention.

FIGS. 4A to 4C are cross sections containing a void-containing layer.

DESCRIPTION OF THE PREFERRED EMBODIMENTS

The embodiment of the invention is described below with reference to drawings. The invention relates to a production process for semiconductor devices, but a production process for a light emitting diode is illustrated below as an example.

FIG. 1 gives a flow chart schematically illustrating the semiconductor device production process according to the embodiment of the invention. In the semiconductor device production process according to the embodiment, a void-containing layer that is made of a group III nitride compound semiconductor (group III-V nitride compound semiconductor) and contains many voids inside is formed first on the growth substrate in step S101. The void-containing layer formation step (step S101) comprises forming a foundation layer (step S101a) and forming an alternating layer (step S101b).

Then, an epitaxial layer of a group III nitride compound semiconductor is formed on the void-containing layer by, for instance, the MOCVD method. The epitaxial group III nitride compound semiconductor layer comprises an n-type layer (n-type semiconductor layer), an active layer (light emitting layer), and a p-type layer (p-type semiconductor layer). The n-type layer, active layer (light emitting layer), and p-type layer are formed of a group III nitride compound semiconductor such as GaN semiconductor.

In the epitaxial group III nitride compound semiconductor layer formation step, an n-type layer comprising, for instance, n-type GaN is formed first on the void-containing layer (step S102). The n-type layer formation step, i.e. step S102, comprises growing an n-type GaN film (step S102a), accelerating the desorption (step S102b), and growing the n-type GaN film (step S102c). Subsequently, an active layer (light emitting layer) that emits light when electrified is formed on the n-type layer (step S103). Furthermore, a p-type layer of a p-type GaN semiconductor is formed on the active layer (light emitting layer) (step S104).

In step S105, a support substrate is bonded above the epitaxial semiconductor layer (p-type layer). Then, in step S106, the growth substrate is peeled off from the epitaxial semiconductor layer (n-type layer, active layer, and p-type layer) at the boundary where the voids are produced. For the surface treatment in step S107, the surface of the epitaxial semiconductor layer (n-type layer) exposed by peeling off the growth substrate is planarized by, for instance, polishing. In step S108, an electrode is formed on the surface-treated epitaxial semiconductor layer (n-type layer). Subsequently, the epitaxial semiconductor layer together with the support substrate is divided into chips (step S109).

FIGS. 2A to 2G and FIGS. 3A to 3F are cross sections illustrating the semiconductor device production process according to the embodiment.

Figure 2A:
FIGS. 2A to 2G are cross sections illustrating the semiconductor device production process according to the embodiment.

The void-containing layer formation step (step S101) is described below with reference to FIGS. 2A to 2D. FIG. 2A schematically illustrates the foundation layer formation step, i.e. step S101a. For instance, a growth substrate 10, which may be a sapphire substrate with a diameter of 2 in. and a thickness of 430 μm, is put on a susceptor and placed in a MOCVD apparatus. In an atmosphere of 13.5 LM of nitrogen and 4.5 LM of hydrogen, trimethyl gallium (TMG) and ammonia ($NH_3$) are supplied at a flow rate of 11 μmol/min and 3.3 LM, respectively, to form a foundation layer 11a of GaN with a thickness of 200 nm at 500° C. After forming the foundation layer 11a, the supply of TMG is stopped and the ambient temperature is increased to 1,000° C. Here, the temperature of 1,000° C. is suitable for growing an n-type GaN film in the n-type layer formation step (step S102).

Figure 2B:
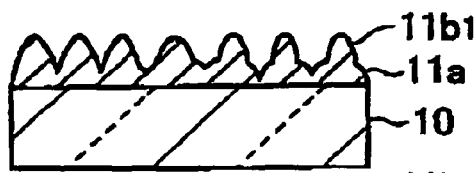

Refer to FIG. 2B. In the alternating layer formation step, i.e. step S101b, an alternating layer 11b of GaN is formed on the foundation layer 11a in an atmosphere of 6 LM of nitrogen and 7.5 LM of hydrogen while maintaining the ambient temperature at 1,000° C. The alternating layer 11b is formed by producing two or more sets, for instance, four sets, of a combination of a first step layer $11b_1$ and a second step layer $11b_2$. The first step layer $11b_1$ is formed under conditions where vertical growth is mainly promoted while the second step layer $11b_2$ is formed under conditions where horizontal growth is mainly promoted.

As illustrated in FIG. 2B, $NH_3$ is supplied at a flow rate of 2.2 LM while supplying TMG at a flow rate of 23 μmol/min to form a first step layer $11b_1$, which is a GaN layer with a thickness of 20 nm, on the foundation layer 11a.

Figure 2C:
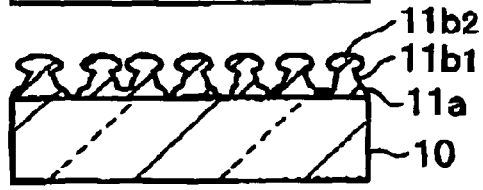

Refer to FIG. 2C. $NH_3$ is supplied at a flow rate of 4.4 LM while supplying TMG at a flow rate of 45 μmol/min to form a second step layer $11b_2$, which is a GaN layer with a thickness of 80 nm, on the first step layer $11b_1$.

Figure 2D:
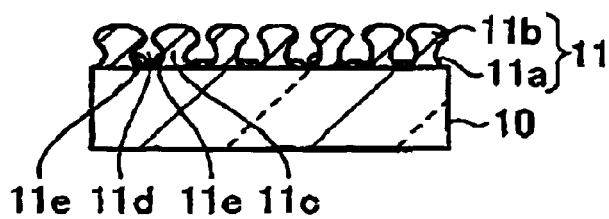

Refer to FIG. 2D. The combination of a first step layer $11b_1$ with a thickness of 20 nm and a second step layer $11b_2$ with a thickness of 80 nm is grown four times repeatedly to produce an alternating layer 11b of GaN with a thickness of 400 nm. The layer constituted of the foundation layer 11a and the alternating layer 11b is referred to as the void-containing layer 11. The void-containing layer 11 comprises columnar structures 11c, each consisting of the foundation layer 11a and the alternating layer 11b, and voids 11d located between the columnar structures 11c. The voids 11d contains GaN crystals 11e inside. The opening ratio measured after the formation of the void-containing layer 11 (after the formation of the alternating layer 11b) was 62%. Here, the opening ratio of the voids 11d is defined as the ratio of the area of the openings R at the top of the voids 11d to the plane area of the layer. At the time of the formation of the void-containing layer 11, it is commonly difficult for the layer to have an opening ratio of less than 50%.

Thus, the first step layer $11b_1$ and the second step layer $11b_2$ are formed alternately and repeatedly under different growth conditions so that an epitaxial semiconductor layer (n-type layer, active layer, and p-type layer) having a high surface smoothness and high crystallinity will be finally produced while leaving contact portions, which act as nuclei of the crystals, and noncontact portions, which are fused together while growing in the horizontal direction.

The n-type layer formation step (step S102) is described below with reference to FIGS. 2E to 2G. In the n-type layer formation step, an n-type GaN film (n-type layer 12) is formed on the void-containing layer 11 to close the voids 11d.

First, in the n-type GaN film growth step (step S102a), an n-type GaN film with a thickness of 1 μm is formed on the void-containing layer 11 while the ambient temperature is maintained at 1,000° C. During the film production, for instance, TMG is supplied at a flow rate of 45 μmol/min, $NH_3$ supplied at a flow rate 5.5 LM, and $SiH_4$ supplied as dopant gas at 86.6 ccm.

Figure 2E:
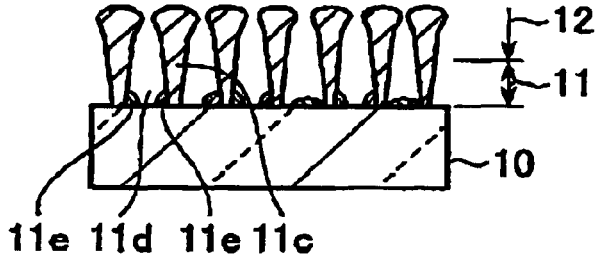

FIG. 2E is a cross section at the end of the n-type GaN film growth step (step S102a). The opening ratio of the voids 11d decreases as the n-type GaN film is formed in the n-type GaN film growth step, i.e. step S102a. The opening ratio measured after the end of step S102a was 19%. In addition to the columnar structures 11c, the voids 11d also contain GaN crystals 11e, as residue of the substrate layer 11a, that adhere to the growth substrate 10.

The supply of TMG is suspend for 5 minutes while maintaining the ambient temperature, $NH_3$ flow rate, and $SiH_4$ flow rate in the desorption acceleration step (step S102b) which follows the n-type GaN film growth step (step S102a). This suspends the n-type GaN film formation to allow GaN to be desorbed from the void-containing layer 11 and the n-type layer 12 (n-type GaN film) formed in step S102a. Furthermore, the GaN crystals 11e in the voids 11d are also desorbed.

Figure 2F:
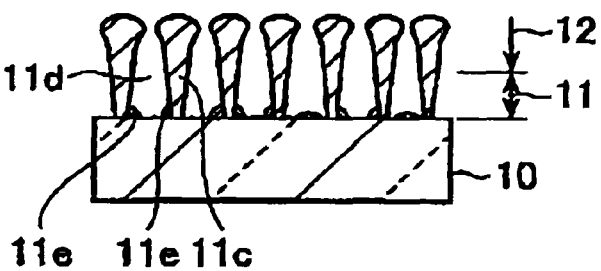

FIG. 2F illustrates a cross section at the end of the desorption acceleration step (step S102b). The desorption acceleration step accelerates the desorption of GaN from the void-containing layer 11 and the n-type layer 12 formed in step S102a, leading to slight thinning of the columnar structures 11c in both layers 11 and 12 and a decrease in the amount of the GaN crystals 11e in the voids 11d due to the desorption.

Figure 2G:
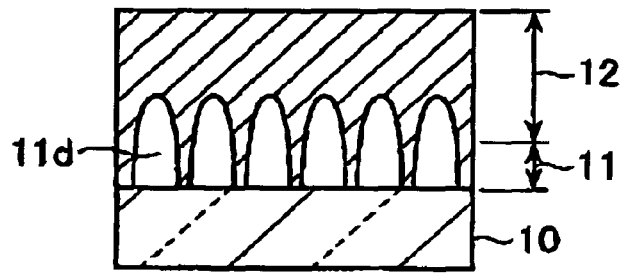

Refer to FIG. 2G. In the n-type GaN film growth step (step S102c) following the desorption acceleration step, the n-type GaN film is grown by 5 μm by restarting the TMG supply (flow rate 45 μmol/min) while maintaining the ambient temperature, $NH_3$ flow rate, and $SiH_4$ flow rate. The voids 11d are dosed as the n-type GaN film grows in the n-type GaN film growth step, i.e. step S102c. The desorption of the GaN crystals 11e, for instance, in the voids 11d continues in the n-type GaN film growth step, i.e. step S102c, until the closure of the voids 11d, and consequently, the GaN crystals 11e hardly remain in the voids 11d.

In the semiconductor device production method according to the embodiment, the desorption acceleration step is carried out before the closure of the openings of the voids 11d so that the GaN crystals 11e in the voids 11d are desorbed and expelled out of the voids 11d, thereby depressing the pressure rise in the voids 11d and preventing the peeling of the growth substrate 10 during, for instance, the formation of the epitaxial semiconductor layer (n-type layer, active layer, and player). This serves for high-yield production of a semiconductor device.

The n-type GaN film formed in the n-type GaN film growth step, i.e. step S102a, according to the embodiment has a thickness of 1 μm (a thickness that leads to an opening ratio of the voids 11d of 19%), but the invention should not be construed as being limited thereto. The desorption acceleration step can be started when the opening ratio reaches a value in the range of 5% or more and 40% or less. If the shift to the desorption acceleration step is delayed until the opening ratio decreases to less than 5%, for instance, the desorption of the GaN crystals 11e in the desorption acceleration step can require a lengthy period of time or cannot proceed adequately. In the columnar GaN film fragments (columnar structures 11c) left between the voids 11d, desorption is taking place at portions joining to the growth substrate 10 when the opening ratio is above 40%, and if the shift to the desorption acceleration step is implemented at such an opening ratio, a large number of GaN film portions not joining to the growth substrate 10 or a large number of portions with small junction areas, and in turn a large number of voids 11d, are produced during the desorption acceleration step, possibly causing the peeling of the growth substrate 10 while the pressure rise caused by the gas of decomposed substances is still relatively small or during, for instance, the formation of the epitaxial semiconductor layer (n-type layer, active layer, and player) regardless of the internal pressure in the voids 11d. In contrast, when the opening ratio decreases to below 40%, the opening ratio has become significantly small and fragments of the n-type layer 12 growing on each of the columnar structures 11c have started to join together as they grow in the horizontal direction. Consequently, even if desorption takes place in the desorption acceleration step in those portions of the columnar structures 11c that join to the growth substrate 10, a large number of columnar structures 11c are connected together via the n-type layer 12 to form a unified structure, preventing the substrate from being peeled even under the pressure caused by the gas of decomposed substances. Thus, the above-mentioned effect can be achieved adequately by implementing the shift to the desorption acceleration step when the opening ratio has decreased to a value in the range of 5% to 40% (where the openings have been closed to some extent and the GaN film fragments have started to join together).

The TMG supply is suspended for 5 minutes in the desorption acceleration step according to the embodiment, but the suspension time may be in the range of 1 minute or more and 10 minutes or less. If the supply suspension time is less than 1 minute, desorption does not proceed sufficiently, making it difficult to achieve adequate effects. If it exceeds 10 minutes, the growth will be stopped at a high temperature for more than 10 minutes, and the n-type GaN film grown in the n-type GaN film growth step, i.e. step S102c can suffer from a decrease in crystallinity and have a large surface roughness.

Furthermore, although the TMG supply is stopped in the desorption acceleration step according to the embodiment, acceleration of the desorption is the only requirement for the desorption acceleration step, and the formation of the n-type GaN film may be performed under conditions where GaN desorption proceeds more actively than the growth of the GaN film. In the case of a flat film surface, the desorption speed is nearly equal to the film formation speed when, for instance, the TMG supply rate is 10 μmol/min. Accordingly, it will be possible to allow the desorption to proceed more actively than the film formation by controlling the TMG supply rate at 10 μmol/min or less in the desorption acceleration step.

As compared with the embodiment where only the supply of TMG (group III material gas) is stopped while maintaining the flow rate of $NH_3$ (group V material gas) in the desorption acceleration step, the n-type GaN film formed in the n-type GaN film growth step, i.e. step S102c, for instance, can decrease in crystallinity if the supply of $NH_3$ is stopped. Thus, it is preferable that the supply of $NH_3$ is continued.

Figure 3A:
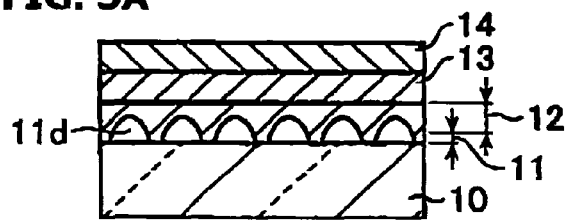
FIGS. 3A to 3F are cross sections illustrating the semiconductor device production process according to the embodiment.

Refer to FIG. 3A. After the n-type layer formation step (step S102), the active layer (light emitting layer) formation step (step S103) is carried out to form an active layer (light emitting layer) 13 on the n-type layer 12.

In the active layer (light emitting layer) formation step, 30 pairs of GaN and $In_yGaN$ layers (each 2 nm) are formed first at an ambient temperature of 760° C. under the conditions of a TMG flow rate of 3.6 μmol/min, trimethyl indium (TMI) flow rate of 3.6 μmol/min, and $NH_3$ flow rate of 4.4 LM to produce a strain relaxation layer (not included in the figures). Here, the TMG and TMI flow rates may be changed in the range of 1 μmol/min to 10 μmol/min. In this case, the flow rates of TMI and TMG are changed simultaneously to adjust the In content to about 20%. The flow rate of $NH_3$ may be changed in the range of 3.3 LM to 5.5 LM. Furthermore, $In_xGaN$ may be formed instead of GaN. In this case, the flow rate is adjusted to meet the equation of x<y. Furthermore, the thickness of the strain relaxation layer may be changed in the range of 50 nm to 300 nm by changing the thickness of the GaN and In$_y$GaN layers or the number of the pairs. The strain relaxation layer may be doped with Si up to a maximum of 5E17 atoms/cm$^2$.

Subsequently, five pairs of a GaN barrier layer and an In$_y$GaN well layer (14 nm and 2 nm, respectively) are formed at an ambient temperature of 730° C. under the conditions of a TMG flow rate of 3.6 µmol/min, TMI flow rate of 10 µmol/min, and NH$_3$ flow rate of 4.4 LM to produce an active layer (light emitting layer) 13 having a multiple quantum well structure. Here, the TMG and TMI flow rates may be changed in the range of 1 µmol/min to 10 µmol/min. In this case, the flow rates of TMI and TMG are changed simultaneously to adjust the value of y, which denotes the composition ratio of In, to about 0.35. The flow rate of NH$_3$ may be changed in the range of 3.3 LM to 5.5 LM. Furthermore, the active layer (light emitting layer) 13 may be doped with Si up to a maximum of 5E17 atoms/cm$^2$.

Subsequently, the p-type layer formation step (step S104) is carried out to form a p-type layer 14 on the active layer (light emitting layer) 13.

In the p-type layer formation step, a p-type AlGaN layer with a thickness of about 40 nm doped with 1E20 atoms/cm$^2$ of Mg (not included in the figures) is formed at an ambient temperature of 870° C. under the conditions of a TMG flow rate of 8.1 µmol/min, trimethyl aluminum (TMA) flow rate of 7.6 µmol/min, and NH$_3$ flow rate of 4.4 LM while also supplying CP2Mg (bis-cyclopentadienyl Mg) as dopant gas. The TMG flow rate may be changed in the range of 4 µmol/min to 20 µmol/min. In this case, the flow rates of TMG and TMA are changed simultaneously to adjust the Al content to about 20%. The flow rate of NH$_3$ may be changed in the range of 3.3 LM to 5.5 LM. Furthermore, the thickness of the p-type AlGaN layer may be changed in the range of 20 nm to 60 nm.

Then, a p-type layer 14 with a thickness of about 200 nm doped with 1E20 atoms/cm$^2$ of Mg is formed at an ambient temperature of 870° C. under the conditions of a TMG flow rate of 18 µmol/min and a NH$_3$ flow rate of 4.4 LM while also supplying CP2Mg as dopant gas. The TMG flow rate may be changed in the range of 8 µmol/min to 36 µmol/min. The flow rate of NH$_3$ may be changed in the range of 3.3 LM to 5.5 LM. Furthermore, the thickness of the p-type layer 14 may be changed in the range of 100 nm to 300 nm.

The p-type layer 14 is activated by carrying out heat treatment in a nitrogen atmosphere at about 900° C. for about 1 minute.

The support substrate bonding step (step S105) is described below with reference to FIGS. 3B and 3C.

Figure 3B:
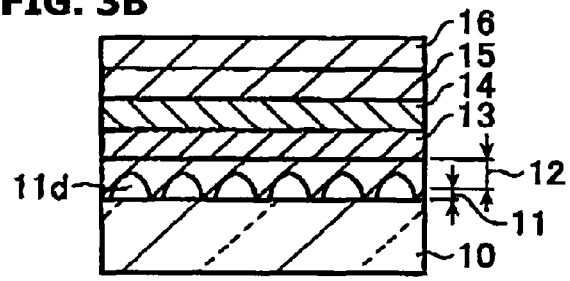

Refer to FIG. 3B. A Pt layer (10 Å) and an Ag layer (3,000 Å) are deposited in this order on the p-type layer 14 by, for instance, vacuum deposition to form an electrode layer 15. The Pt layer serves to maintain ohmic contact with the p-type layer 14 and the Ag layer acts to maintain high reflectance. Subsequently, a Ti layer (1,000 Å), Pt layer (2,000 Å) and Au layer (2,000 Å) are deposited in this order to form a bonding layer 16 on the electrode layer 15. The bonding layer 16 constitutes a bonding portion for bonding to the support substrate 20 as described later.

Figure 3C:
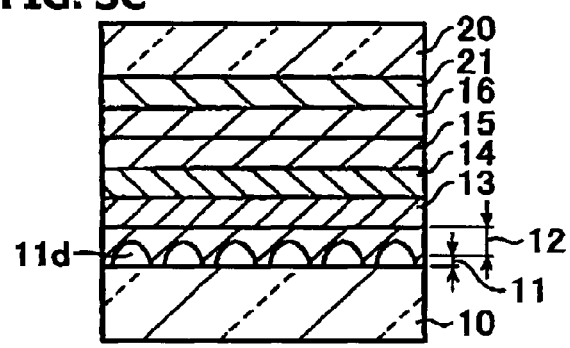

Refer to FIG. 3C. A support substrate 20 is prepared to replace the growth substrate 10 to support the epitaxial semiconductor layer (n-type layer 12, active layer 13, and p-type layer 14). For instance, a Si single crystal substrate may be used as the support substrate 20. A bonding layer 21 consisting of a Pt layer, Ti layer, Ni layer, Au layer, and AuSn layer deposited in this order is formed on the support substrate 20 by, for instance, vacuum deposition. Subsequently, the bonding layer 21 and the bonding layer 16 are brought into close contact and the support substrate 20 is bonded to the surface of the p-type layer 14 in the epitaxial semiconductor layer by thermocompression bonding in a vacuum or nitrogen atmosphere. Here, the support substrate 20 may be formed by plating the bonding layer 21 with metal such as Cu.

Figure 3E:
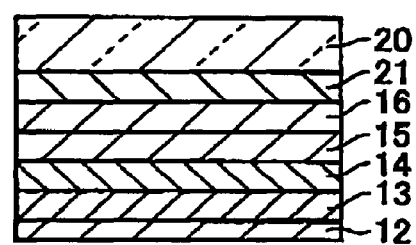
Figure 3D:
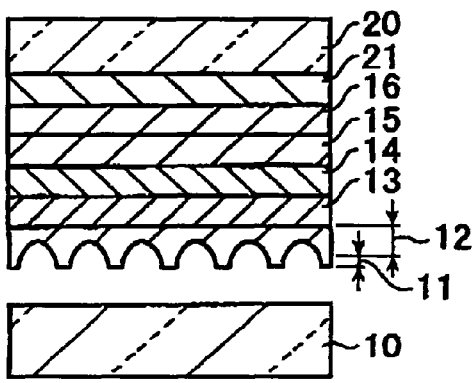

Refer to FIG. 3D. In the growth substrate peeling step (step S106), the growth substrate 10 is removed from the epitaxial semiconductor layer (active layer 13) at the boundary where the voids 11$d$ have been formed. The growth substrate 10 is joined with the epitaxial semiconductor layer (n-type layer 12) by the columnar structures 11$c$ of a width of several micrometers which are located between them and distributed nearly uniformly within the void-containing layer 11, and therefore, by applying a slight external force to this bonding portion, the growth substrate 10 can be peeled easily from, for instance, the void-containing layer 11 as starting point. As an example, the peeling can be achieved by applying a small impact to the growth substrate 10. Peeling of the growth substrate 10 can also be achieved by applying vibrations to the wafer using, for instance, ultrasonic waves. Furthermore, peeling of the growth substrate 10 can also be achieved by infiltrating a liquid in the voids 11$d$ in the void-containing layer 11 and heating it to cause a vapor pressure. In addition, peeling of the growth substrate 10 can be achieved by immersing the wafer in an acid or alkali solution to infiltrate an etchant in the voids 11$d$, followed by etching the columnar structures 11$c$. Furthermore, the LLO method may be used supplementarily for the peeling of the growth substrate 10.

Practically no problems will take place if at the boundary where the voids 11$d$ have been formed, the growth substrate 10 is peeled off naturally by, for instance, the stress in the support substrate 20 before the completion of the support substrate bonding step (step S105). Therefore, the growth substrate peeling step (step S106) can be omitted if the mechanical strength of the void-containing layer 11 is adjusted so that natural peeling is caused by the stress in the support substrate 20 after the completion of the support substrate bonding step.

The surface treatment step (step S107) is described below with reference to FIG. 3E. In the surface treatment step, the surface exposed by peeling the growth substrate 10 is treated with hydrochloric acid to remove Ga melts adhered on the void-containing layer 11, and the surface of the n-type layer 12 is exposed and polished to planarize the n-type layer 12 to a predetermined thickness. In the case where the wafer is immersed in an acid or alkali to infiltrate an etchant in the voids 11$d$ in the growth substrate peeling step, Ga melts are mostly removed then, but if there is a residue, it is removed in this step. The etchant may not necessarily be hydrochloric acid, but others such as, for instance, phosphoric acid, sulfuric acid, KOH, and NaOH may be used as long as they can serve for etching the GaN film. If, for instance, KOH is used as the etchant, many projections in the form of six-sided pyramids, originating in GaN crystal and called microcones, are formed on the surface of the n-type layer 12 to contribute to improvement in the light extraction efficiency. Instead of wet etching, the surface treatment may be carried out by dry etching using Ar plasma or chlorine plasma.

Figure 3F:
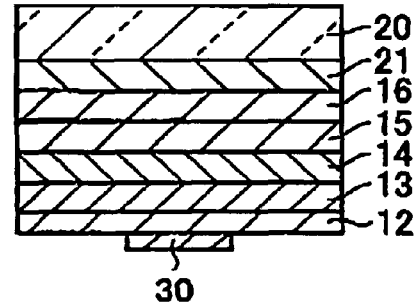

The electrode formation step (step S108) is described below with reference to FIG. 3F. A Ti layer and an Al layer are deposited in this order on the treated surface of the n-type layer 12 by, for instance, vacuum deposition, and for further improving the bonding, a Ti layer/Au layer is deposited on the outermost face to produce an n-type electrode 30. The electrode material may be, for instance, Al layer/Rh layer, Al layer/Ir layer, Al layer/Pt layer, or Al layer/Pd layer, instead of Ti layer/Al layer.

The electrode formation step is followed by a chip separation step (step S109). In the chip separation step, the epitaxial semiconductor layer combined with the support substrate 20 and the n-type electrode 30 formed on it is separated into individual chips. In this step, the epitaxial semiconductor layer surface is patterned first using a resist to form grooves between chips. Then, reactive ion etching is carried out so that the grooves on the surface of the epitaxial semiconductor layer are deepened to reach the electrode layer 15. Subsequently, the support substrate 20 and other layers are diced into chips. Other techniques such as laser scribing may be used instead. Thus, a semiconductor device is produced by carrying out the steps described above.

The semiconductor device production method according to the embodiment is characterized by decreasing the supply of at least part of the materials for forming the layer, while heating, before the closure of the voids 11d, and the embodiment is characterized particularly by decreasing (or suspending) the supply of the group III material or more specifically, by including a desorption acceleration step (step S102b) in the n-type layer formation step (step S102). In the desorption acceleration step, the supply of the group III material gas (TMG) is decreased, while heating, before the closure of the voids 11d in the course of the film formation, in order to allow the desorption to proceed exclusively or preferentially. The desorption acceleration step acts to accelerate the desorption and decomposition of the GaN crystals 11e located on, for instance, the growth substrate 10 (bottom face of the voids 11d) in the voids 11d before the colure of the voids 11d to expel the gas of decomposed substances out of the voids 11d. As a result, the pressure rise in the voids 11d and the peeling of the growth substrate 10 are depressed to enable high yield production of semiconductor devices.

Note that the suspension of part of the material gas supply may be conducted in the void-containing layer formation step (step S101) rather than in the n-type layer formation step (step S102) as in the embodiment.

Thus, the present invention has been described above based on an embodiment thereof, but the invention should not be construed as being limited thereto. Various modifications, alterations, and combinations will become apparent to those skilled in the art.

The process can be applied effectively to the production of general semiconductor devices including light emitting diodes.

What are claimed are:

1. A semiconductor device production process comprising:
   (a) forming on a growth substrate a void-containing layer that is made of a group III nitride compound semiconductor and contains voids,
   (b) forming on the void-containing layer an n-type layer that is made of an n-type group III nitride compound semiconductor and serves to close the voids,
   (c) forming on the n-type layer an active layer made of a group III nitride compound semiconductor,
   (d) forming on the active layer a p-type layer made of a p-type group III nitride compound semiconductor,
   (e) bonding a support substrate above the p-type layer, and
   (f) peeling off the growth substrate at a position in an area where the voids are produced;
   wherein said (a) forming the void-containing layer comprises a first growth step in which the group III nitride compound semiconductor grows under conditions such that vertical growth is mainly promoted, a second growth step in which the group III nitride compound semiconductor grows under conditions such that horizontal growth is mainly promoted, and a repeating step in which steps that are the same as the first growth step and the second growth step, respectively, are alternately repeated; and
   wherein said (a) forming the void-containing layer or said (b) forming the n-type layer comprises a desorption acceleration step in which a supply rate of a group III material is decreased to less than that in the first growth step and the second growth step, under conditions where the desorption of the group III nitride compound semiconductor proceeds more actively than the growth of the layer, while heating, before the voids are closed.

2. A semiconductor device production process as claimed in claim 1,
   wherein the group III nitride compound semiconductor that forms the void-containing layer and the n-type layer is GaN,
   wherein in said (a) forming the void-containing layer and said (b) forming the n-type layer, TMG and $NH_3$ are supplied to form the void-containing layer and the n-type layer, and
   wherein in the desorption acceleration step, only a supply rate of TMG is decreased, and a supply rate of $NH_3$ and an ambient temperature are maintained.

3. A semiconductor device production process as claimed in claim 2, wherein in the desorption acceleration step, the supply rate of TMG is decreased to 10 μmol/min or less.

4. A semiconductor device production process as claimed in claim 2, wherein in the desorption acceleration step, the supply rate of TMG is decreased to 0 μmol/min.

5. A semiconductor device production process as claimed in claim 1, wherein the desorption acceleration step starts at a time when an opening ratio of the voids reaches a value in a range of 5% or more and 40% or less.

6. A semiconductor device production process as claimed in claim 1, wherein the desorption acceleration step is performed for a duration of 1 minute or more and 10 minutes or less.

7. A semiconductor device production process as claimed in claim 1, wherein the desorption acceleration step is performed in said (b) forming the n-type layer.

* * * * *

UNITED STATES PATENT AND TRADEMARK OFFICE
CERTIFICATE OF CORRECTION

Page 1 of 1

PATENT NO. : 8,664,028 B2
APPLICATION NO. : 13/416344
DATED : March 4, 2014
INVENTOR(S) : Yasuyuki Shibata et al.

It is certified that error appears in the above-identified patent and that said Letters Patent is hereby corrected as shown below:

On the Title page; Item (56) References Cited, Under U.S. PATENT DOCUMENTS;

Add --2013/0140517 A1   6/2013   Tang et al.--.

Signed and Sealed this
Twenty-third Day of December, 2014

Michelle K. Lee
*Deputy Director of the United States Patent and Trademark Office*